US012671228B2

(12) United States Patent
Tanaka et al.

(10) Patent No.: US 12,671,228 B2
(45) Date of Patent: Jun. 30, 2026

(54) LIGHT-EMITTING DEVICE

(71) Applicant: NICHIA CORPORATION, Anan (JP)

(72) Inventors: Nobuyuki Tanaka, Anan (JP);
Munetake Fukunaga, Tokushima (JP)

(73) Assignee: NICHIA CORPORATION, Anan (JP)

( * ) Notice: Subject to any disclaimer, the term of this patent is extended or adjusted under 35 U.S.C. 154(b) by 800 days.

(21) Appl. No.: 18/057,216

(22) Filed: Nov. 20, 2022

(65) Prior Publication Data

US 2023/0163562 A1 May 25, 2023

(30) Foreign Application Priority Data

Nov. 25, 2021 (JP) .................................. 2021-191615

(51) Int. Cl.
*H01S 5/026* (2006.01)
*H01S 5/023* (2021.01)
*H01S 5/02345* (2021.01)

(52) U.S. Cl.
CPC ............ *H01S 5/0264* (2013.01); *H01S 5/023* (2021.01); *H01S 5/02345* (2021.01)

(58) Field of Classification Search
CPC .. H01S 5/0262; H01S 5/0264; H01S 5/02345; H01S 5/02325
See application file for complete search history.

(56) References Cited

U.S. PATENT DOCUMENTS

| | | | |
|---|---|---|---|
| 6,072,607 | A | 6/2000 | Tajiri et al. |
| 2001/0015992 | A1* | 8/2001 | Kimizuka ........... H01S 5/02325 |
| | | | 372/50.21 |

| | | | |
|---|---|---|---|
| 2003/0169981 | A1 | 9/2003 | Nakanishi et al. |
| 2012/0106584 | A1* | 5/2012 | Katsuki ................. H01S 5/4031 |
| | | | 372/50.12 |
| 2021/0119409 | A1* | 4/2021 | Miyata .................. H01S 5/0683 |
| 2021/0167576 | A1* | 6/2021 | Kimura ............... H01S 5/02255 |
| 2021/0175681 | A1* | 6/2021 | Murakami ............. H01S 5/022 |
| 2021/0399529 | A1* | 12/2021 | Sorg .................... H01S 5/02255 |
| 2023/0012665 | A1* | 1/2023 | Miura .................. H01S 5/0262 |

FOREIGN PATENT DOCUMENTS

| | | | |
|---|---|---|---|
| JP | H07-161065 A | | 6/1995 |
| JP | H07-273370 A | | 10/1995 |
| JP | H09128798 A | * | 5/1997 |
| JP | 2001-250253 A | | 9/2001 |

(Continued)

*Primary Examiner* — James A Menefee

(74) *Attorney, Agent, or Firm* — Spencer Fane LLP

(57) ABSTRACT

A photodetector is positioned so that imaginary lines perpendicular to an emission end surface of a first light-emitting element through first and second points, respectively, pass through the photodetector. The first and second points are two points at which an imaginary line parallel to the emission end surface through an inside of an outer edge of the first light-emitting element intersects the outer edge of the first light-emitting element in a top view. At least a part of a first wiring region is arranged in a first region between imaginary lines perpendicular to the emission end surface through third and fourth points, respectively. The third and fourth points are two points at which an imaginary line parallel to the emission end surface through an inside of an outer edge of the photodetector intersects the outer edge of the photodetector in the top view.

12 Claims, 8 Drawing Sheets

(56)           References Cited

FOREIGN PATENT DOCUMENTS

JP           2002-359392  A      12/2002
JP           2002-359393  A      12/2002
JP           2004-356304  A      12/2004
JP           2012-094765  A       5/2012
WO             02089274  A1     11/2002
WO       WO-2021125017  A1  *   6/2021   ..........  H01S  5/0683

* cited by examiner

LIGHT-EMITTING DEVICE

CROSS-REFERENCE TO RELATED APPLICATION

This application claims priority to Japanese Patent Application No. 2021-191615, filed on Nov. 25, 2021, the disclosure of which is hereby incorporated herein by reference in its entirety.

BACKGROUND

The present disclosure relates to a light-emitting device.

Japanese Patent Publication No. H7-161065 discloses an optical pickup device including a semiconductor laser element, a light detection element, and a substrate on which an intermediate electrode is formed. In the optical pickup device of the above-mentioned Japanese Patent Publication, the light detection element for detecting return light is disposed in a position laterally separated from an optical axis of laser light emitted from the semiconductor laser element.

SUMMARY

A reduction in size of a light-emitting device including a light-emitting element and a photodetector is achieved.

In an exemplifying and non-limiting embodiment, a light-emitting device according to the present disclosure includes a base member, a first light-emitting element, a photodetector and one or a plurality of wiring lines. The base member has an upper surface and a first wiring region arranged on the upper surface. The first light-emitting element is disposed on the upper surface of the base member and has a first emission end surface configured to emit light. The photodetector is disposed on the upper surface of the base member and has a light receiving surface configured to receive at least a part of the light emitted from the first emission end surface. The photodetector has a second wiring region. The photodetector is positioned so that an imaginary line perpendicular to the first emission end surface through a first point and an imaginary line perpendicular to the first emission end surface through a second point pass through the photodetector. The first point and the second point are two points at which an imaginary line parallel to the first emission end surface through an inside of an outer edge of the first light-emitting element intersects the outer edge of the first light-emitting element in a top view. At least a part of the first wiring region is arranged in a first region between an imaginary line perpendicular to the first emission end surface through a third point and an imaginary line perpendicular to the first emission end surface through a fourth point. The third point and the fourth point are two points at which an imaginary line parallel to the first emission end surface through an inside of an outer edge of the photodetector intersects the outer edge of the photodetector in the top view.

With a light-emitting device according to the present disclosure, a reduction in size of the light-emitting device can be achieved.

DETAILED DESCRIPTION

Figure 1:
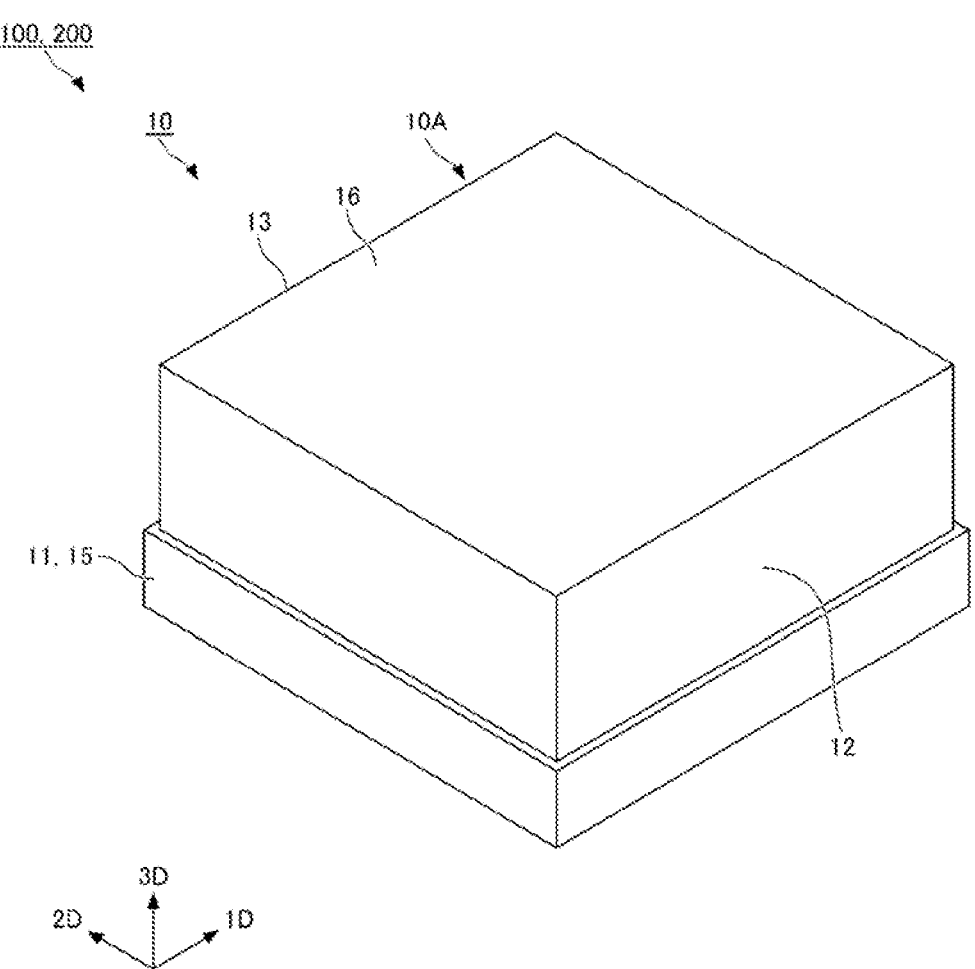
FIG. 1 is a perspective view of a light-emitting device according to a first embodiment.

In the present description or the scope of the claims, a polygon such as a triangle and a quadrangle is not limited to a polygon in a mathematically strict sense and also includes a shape in which a corner of the polygon is processed to be rounded, chamfered, beveled, coved, and the like. Furthermore, a shape obtained by processing not only the corner (an end of a side) of the polygon, but also a middle portion of the side is similarly referred to as a polygon. In other words, a shape partially processed while leaving a polygon shape as a base is included in the "polygon" described in the present description and the scope of the claims.

The same applies not only to the polygon but also to a word representing a specific shape such as a trapezoid, a circle, a protrusion, and a recession. The same applies when dealing with each side forming that shape. In other words, even when a corner and a middle portion of a certain side are processed, the "side" also includes the processed portion. When the "polygon" or "side" not partially processed is to be distinguished from a processed shape, "strict" will be added to the description as in, for example, a "strict quadrangle".

In the present description or the scope of the claims, when there are a plurality of components identified by a certain term and each of the components is to be expressed separately, an ordinal number such as "first" and "second" may be added in front of each of the terms of the components. For example, when it is described that "two light-emitting elements are disposed on a substrate" in the claims, it may be described that "a first light-emitting element and a second light-emitting element are arrayed on a substrate" in the description. The ordinal numbers of "first" and "second" are used to distinguish the two light-emitting elements. An order of the ordinal numbers has no special meaning. A term of a component provided with the same ordinal number may not refer to the same component between the description and the claims. For example, when components identified by terms of a "first light-emitting element", a "second light-emitting element", and a "third light-emitting element" are described in the description, a "first light-emitting element" and a "second light-emitting element" in the claims may correspond to the "first light-emitting element" and the "third light-emitting element" in the description. Furthermore, in claim 1 described in the claims, when the term of the "first light-emitting element" is used and the term of the "second light-emitting element" is not used, the invention according to claim 1 includes at least one light-emitting element. This light-emitting element is not limited to the "first light-emitting element" in the description and can correspond to the "second light-emitting element" or the "third light-emitting element" in the description.

In the present description or the claims, terms indicating a specific direction or position (for example, "upper", "lower", "right", "left", and other terms including those terms) may be used. The terms are merely used to make it easy to understand a relative direction or position in the referenced drawing. As long as the relative direction or position is the same as that described in the referenced drawing using the term such as "upper" or "lower", in drawings other than the drawings of the present disclosure, actual products, manufacturing devices, and the like, components need not necessarily be arranged in the same manner as in the referenced drawing.

A size, a size ratio, a shape, an arrangement interval, and the like of a component or a member illustrated in the drawings may be exaggerated for ease of understanding. Furthermore, in order to avoid excessive complication of the drawings, illustration of some elements may be omitted.

Embodiments of the present invention will be described below with reference to the drawings. The embodiments are for embodying the technical concept of the present invention but are not intended to limit the present invention. A numerical value, a shape, a material, a step, an order of the step, and the like indicated in the description of the embodiments are merely one example, and various modifications can be made as long as a technical contradiction does not arise. In the following description, a component identified by the same term and reference sign is the same component or a similar component, and duplicate descriptions of the components may be omitted.

First Embodiment

Figure 2:
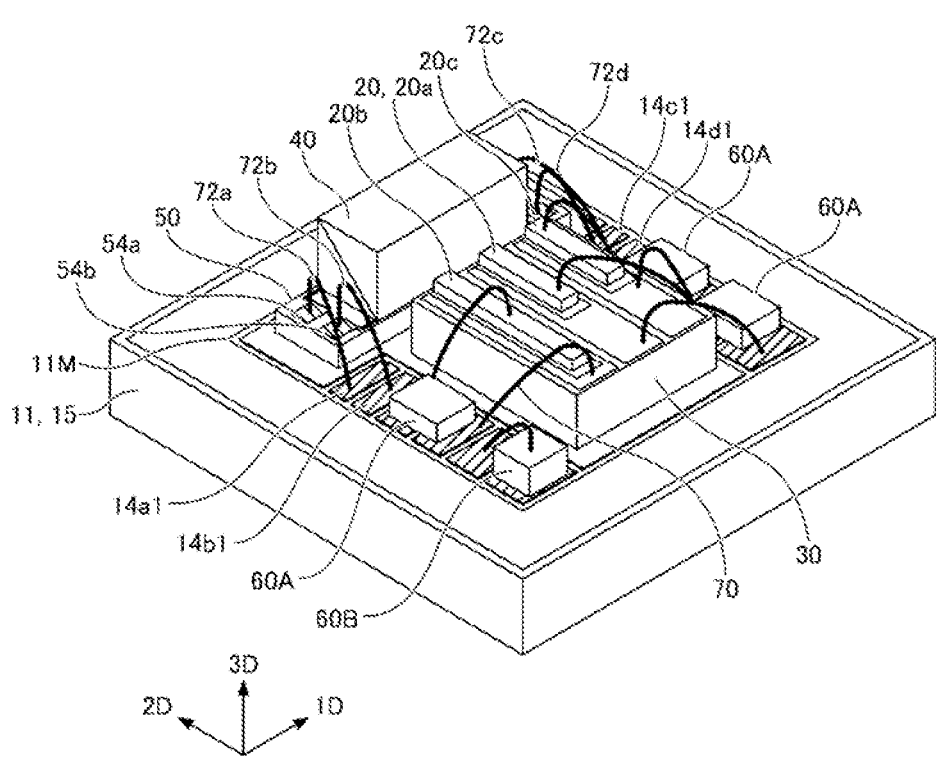
FIG. 2 is a perspective view of the light-emitting device according to the first embodiment excluding a cap of a package.
Figure 3:
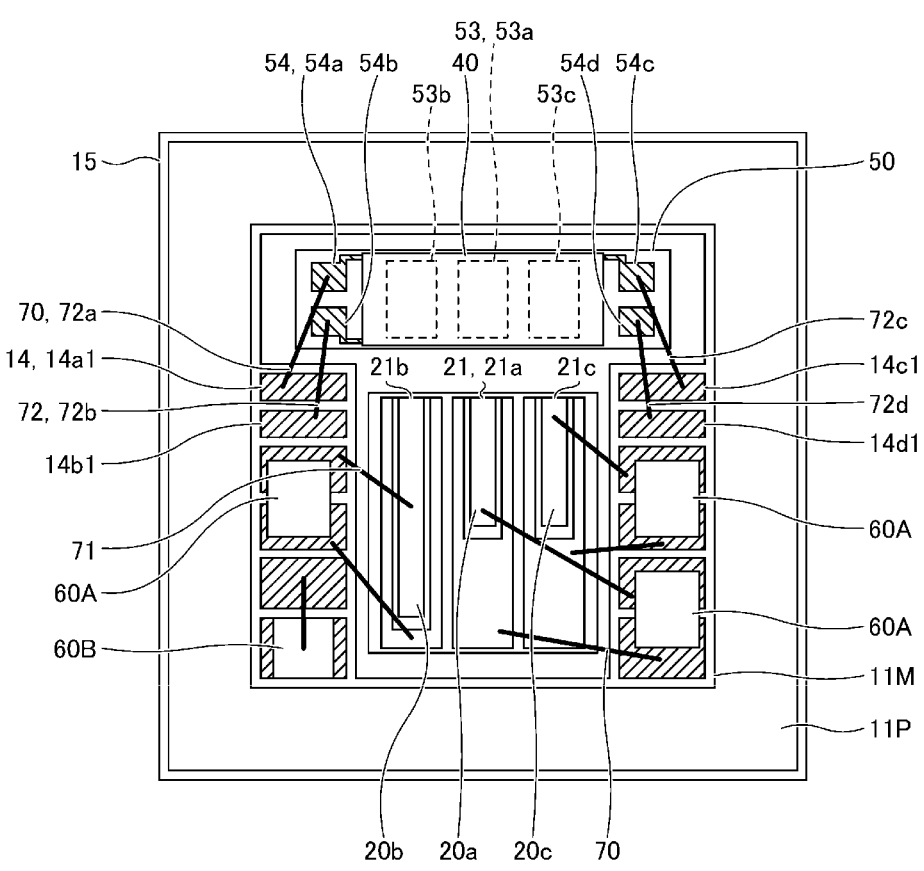
FIG. 3 is a top view of the light-emitting device according to the first embodiment excluding the cap of the package.
Figure 3:
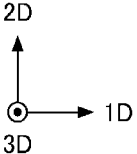
Figure 4:
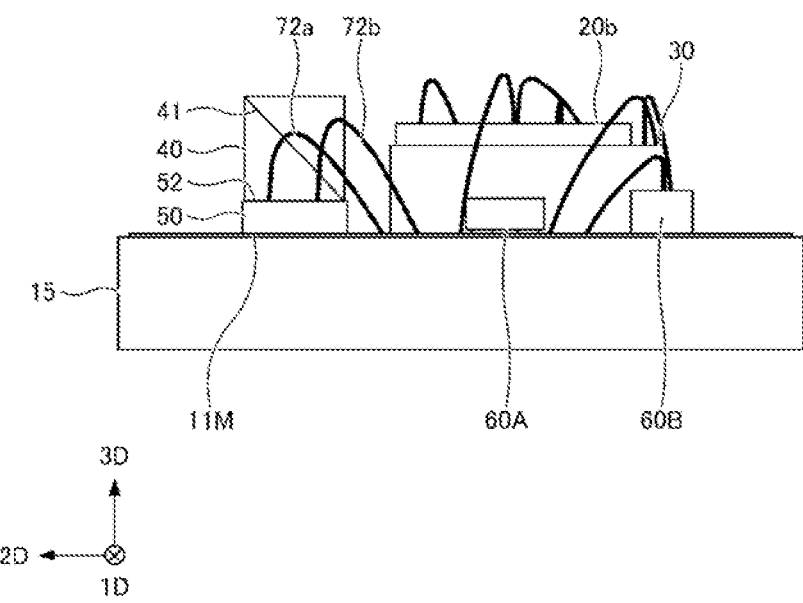
FIG. 4 is a front view of the light-emitting device according to the first embodiment excluding the cap of the package.
Figure 5:
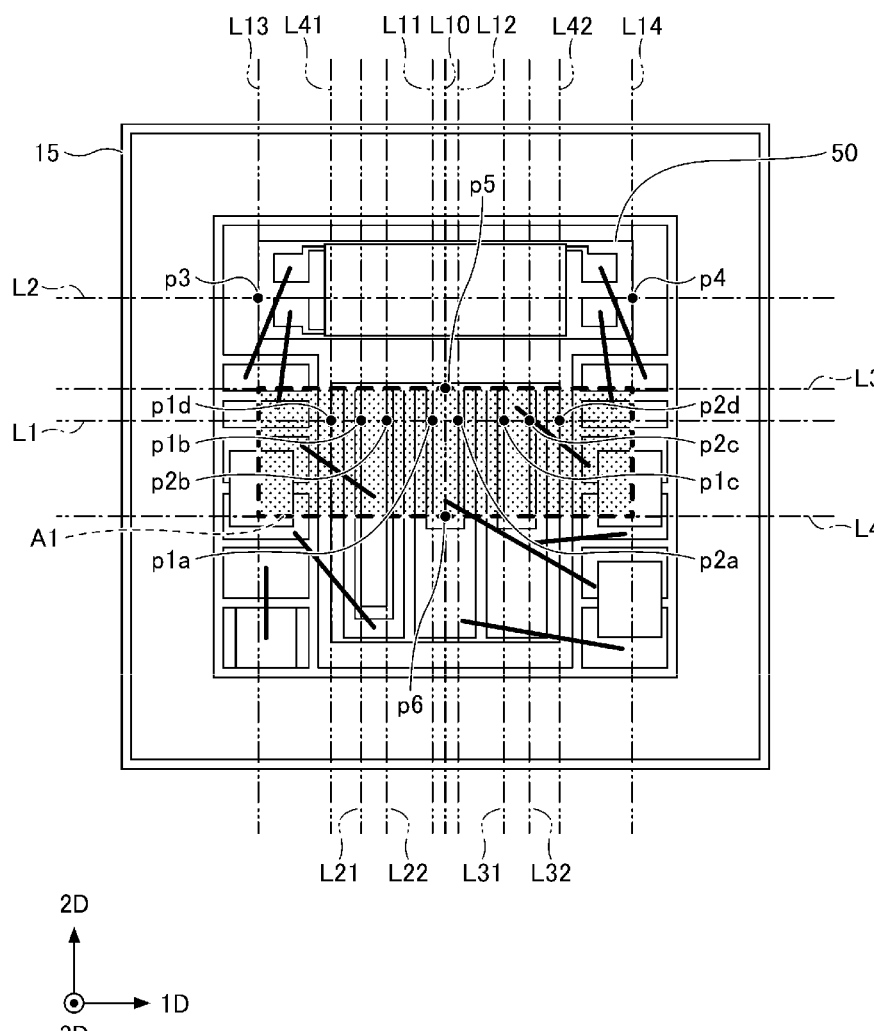
FIG. 5 is a diagram for a supplemental description of predetermined points, imaginary lines, regions, and the like in the light-emitting device according to the first embodiment.

A light-emitting device 100 according to a first embodiment will be described with reference to the drawings. FIGS. 1 to 5 are drawings for illustrating one exemplary form of the light-emitting device 100. FIG. 1 is a perspective view of the light-emitting device 100 according to the present embodiment. FIG. 2 is a perspective view of the light-emitting device 100 in a state where a cap 16 of a package 10 is removed. FIG. 3 is a top view of the same state as illustrated in FIG. 2. FIG. 4 is a front view of the same state as illustrated in FIG. 2. FIG. 5 is a diagram for a supplemental description of predetermined points, imaginary lines, regions, and the like in the light-emitting device 100 according to the present embodiment.

The light-emitting device 100 includes a plurality of components. The plurality of components include the package 10, one or a plurality of light-emitting elements 20, a submount 30, an optical member 40, a photodetector 50, a protective element 60A, a temperature measuring element 60B, and one or a plurality of wiring lines 70.

First, each of the components will be described.

Package 10

The package 10 includes a base member 11 including a mounting surface 11M, and a side wall portion 12 surrounding the mounting surface 11M. The mounting surface 11M of the base member 11 is a region in which another component is disposed. Furthermore, the package 10 includes a substrate 15 and the cap 16 fixed to the substrate 15. The substrate 15 includes the base member 11, and the cap 16 includes the side wall portion 12.

In a top view, both of outer shapes of the base member 11 and the cap 16 are rectangular. The outer shapes do not need to be rectangular, and may be polygonal other than quadrangular, or a part or the whole of the outer shapes may include a curved line, a bend, or a protrusion and a recession.

The base member 11 includes one or more upper surfaces. The one or more upper surfaces included in the base member 11 include the mounting surface 11M. The one or more upper surfaces included in the base member 11 include a peripheral region 11P surrounding the mounting surface 11M. In the illustrated example of the light-emitting device 100, the mounting surface 11M and the peripheral region 11P are located on the same plane. Note that the mounting surface 11M and the peripheral region 11P may not be provided on the same plane and may be provided on, for example, different upper surfaces having a height difference.

The peripheral region 11P is a region in which the cap 16 is bonded. In the top view, the peripheral region 11P is provided between the outer shape of the base member 11 and an outer shape of the mounting surface 11M. In the example of the light-emitting device 100 illustrated by the drawings, in the top view, the outer shape of the mounting surface 11M is rectangular, and the peripheral region 11P is provided around four sides of the rectangle. A lower surface of a side surface portion of the cap 16 is bonded to the upper surface of the peripheral region 11P. A metal film for bonding to the cap 16 can be disposed in the peripheral region 11P.

The package 10 includes a light-transmissive region 13 being a region having light transmissivity. Further, the package 10 includes a light extraction surface 10A including the light-transmissive region 13. The light extraction surface 10A is included in one surface of one or a plurality of outer side surfaces in the side wall portion 12 of the package 10. Note that "having light transmissivity" means a property in which a transmittance of main light incident thereon is equal to or more than 80%. For example, provided that infrared light is the main light, "having light transmissivity" holds true when a transmittance for the infrared light is equal to or more than 80%.

The whole cap 16 may be formed of a light-transmissive material, or only the side surface portion of the cap 16 may be formed of the light-transmissive material. A part of the cap 16 including the light extraction surface 10A may be formed of a first light-transmissive material, and a part other than the part of the cap 16 including the light extraction surface 10A may be formed of a second light-transmissive material or a non-light-transmissive material.

The cap 16 can be formed of an upper surface portion and the side surface portion that are integral. For example, the cap 16 having a desired shape such as, for example, a box shape can be manufactured from the light-transmissive material such as glass, plastic, and quartz by using a processing technique such as molding or etching. The cap 16 may be formed by bonding the upper surface portion (a lid portion) and the side surface portion (a frame portion) separately formed of different materials as main materials thereof. For example, the upper surface portion can include monocrystalline silicon or polycrystalline silicon as the main material, and the side surface portion can include glass as the main material. For example, the cap 16 can have dimensions having a height equal to or less than 2.5 mm and having, in the top view, a length of one side equal to or less than 8 mm in an outer shape of a rectangular shape. Furthermore, for example, the cap 16 can have dimensions having a height equal to or less than 2 mm and having, in the top view, a length of one side equal to or less than 4 mm in the outer shape of the rectangular shape.

In the example of the light-emitting device 100 illustrated by the drawings, the light extraction surface 10A is perpendicular to a direction in which the mounting surface 11M extends. Note that the term "perpendicular" used here allows a difference within ±5 degrees. Furthermore, the light extraction surface 10A does not need to be perpendicular to the direction in which the mounting surface 11M of the base member 11 extends and may be inclined.

A plurality of wiring regions 14 are provided on the upper surface of the base member 11. The plurality of wiring regions 14 are provided on the mounting surface 11M of the base member 11. In FIG. 3, instead of providing a reference sign to all of the wiring regions 14, similar hatching is applied to all of the wiring regions 14. The plurality of wiring regions 14 can pass through an interior of the base member 11 and can be electrically connected to a wiring region provided on a lower surface of the base member 11. The wiring region that is to be electrically connected to the wiring region 14 is not limited to being provided on the lower surface of the base member 11 and can be provided on another external surface (upper surface or outer side surface) of the base member 11. The plurality of wiring regions 14 can be a film, a layer, or a via that is formed of a conductor such as metal and is patterned.

The substrate 15 can be formed of ceramic as the main material. Examples of the ceramic used for the substrate 15 include aluminum nitride, silicon nitride, aluminum oxide, silicon carbide, and the like.

In the present embodiment, the substrate 15 can be formed of, for example, a ceramic substrate including a plurality of metal vias therein. The substrate 15 preferably includes a material having heat dissipation (a material having high thermal conductivity) higher than that of ceramic in a portion in thermal contact with a component that generates heat. Examples of such a material may include copper, aluminum, iron, copper molybdenum, copper tungsten, and copper-diamond composite materials.

Light-Emitting Element 20

The light-emitting element 20 includes an emission end surface 21 that emits light. Examples of the light-emitting element 20 include a semiconductor laser element. The light-emitting element 20 can have an outer shape of the rectangle in the top view. When the light-emitting element 20 is an edge-emitting semiconductor laser element, a side surface intersecting one side of two short sides of the rectangle in the top view is the emission end surface 21 of light. In the example, an upper surface and a lower surface of the light-emitting element 20 have an area greater than that of the emission end surface 21. The light-emitting element 20 is not limited to an edge-emitting semiconductor laser element and may be a surface-emitting semiconductor laser element, a light-emitting diode (LED), or the like.

The light-emitting element 20 is a single emitter including at least one emitter. Note that the light-emitting element 20 may be a multi-emitter including two or more emitters. When the light-emitting element 20 is a semiconductor laser element including a plurality of emitters, one common electrode can be provided on one of the upper surface and the lower surface of the light-emitting element 20, and two electrodes corresponding to the emitters can be provided on the other of the upper surface and the lower surface.

Light emitted from the emission end surface 21 of the light-emitting element 20 is divergent light that spreads.

Note that the light may not be the divergent light. When the light-emitting element 20 is a semiconductor laser element, the divergent light (laser light) emitted from the semiconductor laser element forms a far field pattern (hereinafter referred to as an "FFP") of an elliptical shape on a plane parallel to a light emission surface. The FFP indicates a shape and a light intensity distribution of the emitted light at a position spaced apart from the light emission surface.

Light passing through the center of the elliptical shape of the FFP, in other words, light having a peak intensity in the light intensity distribution of the FFP, is referred to as light traveling on an optical axis. Also, the optical path of the light advancing on an optical axis is referred to as the optical axis of the light. Furthermore, based on the light intensity distribution of the FFP, light having an intensity of $1/e^2$ or more with respect to a peak intensity value is referred to as light of a "main portion".

In the elliptical shape of the FFP of the light emitted from the light-emitting element 20 being a semiconductor laser element, a minor axis direction of the elliptical shape is referred to as a parallel direction of the FFP, and a major axis direction is referred to as a perpendicular direction of the FFP. A plurality of layers including an active layer constituting the semiconductor laser element are layered in the perpendicular direction of the FFP.

Based on the light intensity distribution of the FFP, an angle corresponding to a full width at half maximum of the light intensity distribution is a spread angle of light of the semiconductor laser element. The spread angle of light in the perpendicular direction of the FFP is referred to as a perpendicular spread angle, and the spread angle of light in the parallel direction of the FFP is referred to as a parallel spread angle.

As the light-emitting element 20, for example, a semiconductor laser element that emits blue light, a semiconductor laser element that emits green light, a semiconductor laser element that emits red light, or the like can be employed. A semiconductor laser element that emits light other than blue, green, and red light may also be employed.

Blue light refers to light having an emission peak wavelength within a range from 420 nm to 494 nm. Green light refers to light having the emission peak wavelength within a range from 495 nm to 570 nm. Red light refers to light having the emission peak wavelength within a range from 605 nm to 750 nm.

Examples of the semiconductor laser element that emits blue light or the semiconductor laser element that emits green light include a semiconductor laser element including a nitride semiconductor. For example, GaN, InGaN, and AlGaN can be used as the nitride semiconductor. Examples of the semiconductor laser element that emits red light include a semiconductor laser element including an InAlGaP-based, GaInP-based, GaAs-based, or AlGaAs-based semiconductor.

Submount 30

The submount 30 includes two bonding surfaces and is formed in a rectangular parallelepiped shape. One of the bonding surfaces is provided on an opposite side from the other bonding surface. A distance between the two bonding surfaces is less than a distance between other facing two surfaces. A shape of the submount 30 may not be limited to a rectangular parallelepiped. The submount 30 can be formed using, for example, silicon nitride, aluminum nitride, or silicon carbide. A metal film for bonding is provided on the bonding surface.

Optical Member 40

The optical member 40 includes a partial reflective surface 41. The partial reflective surface 41 reflects a part of incident light and transmits the remaining light. The light incident on the partial reflective surface 41 is divided into two lights traveling in different directions. The two divided lights include light having the same wavelength. The optical member 40 divides the same wavelength component of the incident light into two at a predetermined ratio.

For example, one of the two lights divided by the optical member 40 can be used as primary light (main light), and the other of the two lights can be used as light (monitor light) for monitoring to control the main light. Furthermore, for example, both of the two lights can also be used as the main light.

When the incident light is divided into the main light and the monitor light, intensity of the monitor light is less than intensity of the main light. For example, the partial reflective surface 41 transmits 80% or more of the incident light and uses the light as the main light, and reflects 20% or less of the incident light and uses the light as the monitor light. Further, the intensity of the monitor light may be in a range from 5% to 10% of the intensity of the main light. Furthermore, for example, the intensity can be approximately 5% or less than 5%.

Reflectance of the partial reflective surface 41 may vary depending on a wavelength of the incident light. Thus, when light of a different color is incident on one partial reflective surface 41, the reflectance may vary depending on the color. Note that the reflectance does not need to be equal for light of all colors. Design is performed so as to set appropriate reflectance for target light reflected by the partial reflective surface 41.

The partial reflective surface 41 is inclined relative to a lower surface of the optical member 40. The partial reflective surface 41 is formed of a flat surface having an inclination angle in, for example, a range from 40 degrees to 50 degrees with respect to the lower surface of the optical member 40. In the illustrated example of the light-emitting device 100, the partial reflective surface 41 is formed of a flat surface having the inclination angle of 45 degrees with respect to the lower surface.

The optical member 40 is formed in a rectangular parallelepiped shape. Note that a shape of the optical member 40 is not limited to the rectangular parallelepiped. Furthermore, the optical member 40 includes an upper surface parallel to the lower surface. A bonding surface for fixing the optical member 40 to another member is preferably included. For example, the lower surface of the optical member 40 can function as the bonding surface.

Photodetector 50

The photodetector 50 includes a light receiving surface 52. The photodetector 50 includes an upper surface, a lower surface, and one or a plurality of side surfaces. The light receiving surface 52 is provided on the upper surface of the photodetector 50. An outer shape of the photodetector 50 is a rectangular parallelepiped. Note that the outer shape may be different from the rectangular parallelepiped.

One or a plurality of light receiving regions 53 are provided on the light receiving surface 52. Each of the one or the plurality of light receiving regions 53 is a photoelectric conversion element that outputs an electrical signal in accordance with an intensity or the amount of light of the incident light. A typical example of such a photoelectric conversion element is a photodiode.

The photodetector 50 can be formed of the plurality of light receiving regions 53 including a first light receiving region 53a and a second light receiving region 53b. Furthermore, the photodetector 50 can be formed of the plurality of light receiving regions 53 further including a third light receiving region 53c. Note that the number of the light receiving regions 53 is not limited to three.

The plurality of light receiving regions 53 are disposed side by side at a predetermined interval. Here, a direction in which the plurality of light receiving regions 53 are disposed side by side is referred to as a "first direction". Furthermore, in the top view, a direction perpendicular to the first direction is referred to as a "second direction". Furthermore, a direction perpendicular to the first direction and the second direction is referred to as a "third direction". 1D in the drawings is an example of the "first direction", 2D is an example of the "second direction", and 3D is an example of the "third direction".

The light receiving surface 52 has a rectangular outer shape. Furthermore, the light receiving surface 52 has a length in the first direction greater than a length in the second direction. Note that the length, in the first direction, of the light receiving surface 52 of the photodetector 50 may be the same as or less than the length, in the second direction, of the light receiving surface 52.

The plurality of light receiving regions 53 are disposed side by side at the interval. In other words, in the top view, the light receiving regions 53 are spaced apart from each other, and do not overlap each other. Note that the interval may not be regular. Further, the plurality of light receiving regions 53 are disposed side by side so as to be close to each other.

Each of the light receiving regions 53 has a rectangular outer shape on the light receiving surface 52. The shape of the light receiving region 53 is not limited to the rectangular shape and can be appropriately designed according to a shape of the light incident on the light receiving surface 52. In the example of the photodetector 50 illustrated by the drawings, each of the light receiving regions 53 has a rectangular outer shape. Two sides (short sides in a case of the rectangle) of four sides constituting the rectangle of the light receiving region 53 are parallel to the first direction. The term "parallel" used here allows a difference within ±5 degrees.

The photodetector 50 includes one or a plurality of wiring regions 54. The one or the plurality of wiring regions 54 are provided on the upper surface of the photodetector 50. Note that the one or the plurality of wiring regions 54 may be provided on a surface other than the upper surface of the photodetector 50. Each of the wiring regions 54 is electrically connected to the light receiving region 53.

In the example of the photodetector 50 illustrated by the drawings, electrical connection to all of the light receiving regions 53 disposed on the light receiving surface 52 is achieved by the plurality of wiring regions 54. Specifically, three of four wiring regions 54 are anode electrodes of any of three light receiving regions 53 without sharing the same anode electrode with each other. The remaining one of the four wiring regions 54 is a cathode electrode common to the three light receiving regions 53.

Protective Element 60A

The protective element 60A is a circuit element for preventing breakage of a specific element (the light-emitting element 20, for example) as a result of an excessive current flowing through the element. A typical example of the protective element 60A is a voltage regulator diode such as a Zener diode. As the Zener diode, an Si diode can be employed.

Temperature Measuring Element 60B

The temperature measuring element 60B is an element used as a temperature sensor for measuring an ambient temperature. For example, a thermistor can be used as the temperature measuring element 60B.

Wiring Line 70

The wiring line 70 is formed of a conductor having a linear shape with bonding portions at both ends. In other words, the wiring line 70 includes the bonding portions to be bonded to other components, at both ends of the linear portion. The wiring line 70 is, for example, a metal wire. Examples of the metal include gold, aluminum, silver, copper, or the like.

Next, the light-emitting device 100 will be described.

Light-Emitting Device 100

In an example of the light-emitting device 100 to be described below, the one or the plurality of light-emitting elements 20 are edge-emitting semiconductor laser elements. Furthermore, the plurality of wiring lines 70 include one or a plurality of wiring lines 71 electrically connected to the corresponding light-emitting elements 20, and one or a plurality of wiring lines 72 electrically connected to the photodetector 50. In the illustrated light-emitting device 100, each of wiring lines 72a, 72b, 72c, and 72d is the wiring line 72 electrically connected to the photodetector 50.

In the light-emitting device 100, the one or the plurality of light-emitting elements 20 are disposed on the mounting surface 11M. The one or the plurality of light-emitting elements 20 are surrounded by the side wall portion 12. Each of the light-emitting elements 20 is disposed on the mounting surface 11M via the submount 30. Note that the plurality of light-emitting elements 20 may be disposed on one submount 30. Furthermore, the one or the plurality of light-emitting elements 20 may be directly disposed on the mounting surface 11M without the submount 30 interposed therebetween.

The one or the plurality of light-emitting elements 20 can include a first light-emitting element 20a and a second light-emitting element 20b. Furthermore, the one or the plurality of light-emitting elements 20 can include a third light-emitting element 20c. In the top view, the first light-emitting element 20a is disposed between the second light-emitting element 20b and the third light-emitting element 20c.

Light emitted from the first light-emitting element 20a has a peak wavelength different from that of light emitted from the second light-emitting element 20b. Light emitted from the third light-emitting element 20c has a peak wavelength different from those of the light emitted from the first light-emitting element 20a and the light emitted from the second light-emitting element 20b.

For example, the first light-emitting element 20a is a semiconductor laser element that emits green light. Furthermore, the second light-emitting element 20b is a semiconductor laser element that emits red light. Furthermore, the third light-emitting element 20c is a semiconductor laser element that emits blue light. Note that a color of the light emitted from each of the light-emitting elements 20 is not limited thereto and is also not limited to visible light.

The first light-emitting element 20a and the second light-emitting element 20b are disposed side by side in the first direction in the top view. An emission end surface 21a of the first light-emitting element 20a and an emission end surface 21b of the second light-emitting element 20b are disposed side by side so as to be parallel to each other. The emission end surface 21a and the emission end surface 21b face the same direction. Note that the emission end surface 21a and the emission end surface 21b may not be parallel and may not face the same direction.

The first light-emitting element 20a and the third light-emitting element 20c are disposed side by side in the first direction in the top view. The emission end surface 21a of the first light-emitting element 20a and an emission end surface 21c of the third light-emitting element 20c are disposed side by side so as to be parallel to each other. The emission end surface 21a and the emission end surface 21c face the same direction. Note that the emission end surface 21a and the emission end surface 21c may not be parallel and may not face the same direction.

The one or the plurality of light-emitting elements 20 each emit light in a direction from the emission end surface 21 toward the light extraction surface 10A. The one or the plurality of light-emitting elements 20 each emit the divergent light. The light emitted from the emission end surface 21 and traveling on the optical axis travels in parallel with the mounting surface 11M.

In the light-emitting device 100, the submount 30 is disposed on the mounting surface 11M. The submount 30 is bonded to the light-emitting elements 20 on one of the bonding surfaces of the submount 30. Furthermore, the submount 30 is bonded to the mounting surface 11M on the other of bonding surfaces of the submount 30 opposite to the one of the bonding surfaces. Note that the light-emitting device 100 may include a plurality of the submounts 30.

In the light-emitting device 100, the photodetector 50 is disposed on the mounting surface 11M. The photodetector 50 is surrounded by the side wall portion 12. The photodetector 50 is disposed between the light extraction surface 10A and the light-emitting element 20 in the top view. The photodetector 50 is disposed such that the light receiving surface 52 faces upward. In the example of the light-emitting device 100 illustrated by the drawings, the light receiving surface 52 is parallel to the mounting surface 11M. The term "parallel" used here allows a difference within ±5 degrees.

The plurality of wiring regions 14 provided on the upper surface of the base member 11 include the wiring region 14 electrically connected to the light-emitting element 20, and the wiring region 14 electrically connected to the photodetector 50. Wiring regions 14a1, 14b1, 14c1, and 14d1 illustrated in FIG. 3 are the wiring regions 14 electrically connected to the photodetector 50. The one or the plurality of wiring regions 14 electrically connected to the photodetector 50 are collectively referred to as a first wiring region below. It can be said that the first wiring region including the plurality of wiring regions 14 spaced apart from each other is provided in the light-emitting device 100.

The photodetector 50 is disposed on an upper surface of the substrate 15 so as to be passed by an imaginary line L11 perpendicular to the emission end surface 21a through one point p1a (one example of the first point) of two points at which an imaginary line L1 parallel to the emission end surface 21a through the inside of an outer edge of the first light-emitting element 20a intersects the outer edge of the first light-emitting element 20*a* in the top view. Furthermore, in the top view, the photodetector 50 is disposed on the upper surface of the substrate 15 so as to be passed by an imaginary line L12 perpendicular to the emission end surface 21*a* through the other point p2*a* (one example of the second point) of the two points.

Furthermore, at least a part of the first wiring region is provided in a region A1 between an imaginary line L13 perpendicular to the emission end surface 21 through one point p3 (one example of the third point) of two points at which an imaginary line L2 parallel to the emission end surface 21*a* through the inside of an outer edge of the photodetector 50 intersects the outer edge of the photodetector 50 in the top view, and an imaginary line L14 perpendicular to the emission end surface 21 through the other point p4 (one example of the fourth point) of the two points. In this way, a size of the light-emitting device 100 can be reduced in the first direction 1D.

The photodetector 50 is disposed on the upper surface of the substrate 15 so as to be passed by an imaginary line L21 or/and L31. The imaginary line L21 or/and L31 is perpendicular to the emission end surface 21*b* or/and 21*c* through one point p1*b* or/and p1c (examples of the first point) of two points at which the imaginary line L1 intersects an outer edge of the second light-emitting element 20*b* or/and the third light-emitting element 20*c* in the top view. The imaginary line L1 is parallel to the emission end surface 21*b* or/and the emission end surface 21*c* and passes through the inside of the outer edge of the second light-emitting element 20*b* or/and the third light-emitting element 20*c*. Furthermore, in the top view, the photodetector 50 is disposed on the upper surface of the substrate 15 so as to be passed by an imaginary line L22 or/and L32 perpendicular to the emission end surface 21*b* or/and the emission end surface 21*c* through the other point p2*b* or/and p2*c* (examples of the second point) of the two points.

The photodetector 50 is disposed on the upper surface of the substrate 15 so as to be passed by an imaginary line L41 perpendicular to the emission end surface 21*a* through one point p1*d* of two points at which the imaginary line L1 parallel to the emission end surface 21*a* through the inside of an outer edge of the submount 30 intersects the outer edge of the submount 30 in the top view. Furthermore, in the top view, the photodetector 50 is disposed on the upper surface of the substrate 15 so as to be passed by an imaginary line L42 perpendicular to the emission end surface 21*a* through the other point p2*d* of the two points.

At least a part of each of the plurality of wiring regions 14 included in the first wiring region is provided in the region A1. In the illustrated light-emitting device 100, at least a part of each of the wiring regions 14*a*1, 14*b*1, 14*c*1, and 14*d*1 is provided in the region A1.

In the top view, the plurality of wiring regions 14 included in the first wiring region include, with the imaginary line L11 as a boundary, the wiring region 14 provided in a region including the point p2*a*, and the wiring region 14 provided in a region not including the point p2*a*. The plurality of wiring regions 14 are distributed and arranged in the two regions in such a manner, and thus a space of the upper surface of the base member 11 can be effectively used, and a reduction in size of the light-emitting device 100 can be achieved.

The first wiring region includes two wiring regions 14 at least a part of which is provided in the region not including the point p2*a* with the imaginary line L11 as the boundary. In the light-emitting device 100 illustrated by the drawings, the wiring region 14*a*1 and the wiring region 14*b*1 correspond to the two wiring regions 14. Further, all of the two wiring regions 14 are provided in the region not including the point p2*a* with the imaginary line L11 as the boundary.

Furthermore, the first wiring region includes two wiring regions 14 at least a part of which is provided in a region not including the point p1*a* with the imaginary line L12 as a boundary. In the light-emitting device 100 illustrated by the drawings, the wiring region 14*c*1 and the wiring region 14*d*1 correspond to the two wiring regions 14. Furthermore, all of the two wiring regions 14 are provided in the region not including the point p1*a* with the imaginary line L12 as the boundary.

In the top view, the second light-emitting element 20*b* is disposed in the region not including the point p2*a* with the imaginary line L11 as the boundary, and the third light-emitting element 20*c* is disposed in the region not including the point p1*a* with the imaginary line L12 as the boundary. The second light-emitting element 20*b* is disposed in a position closer to the wiring region 14 provided in the region not including the point p2*a* with the imaginary line L11 as the boundary than the wiring region 14 provided in the region not including the point p1*a* with the imaginary line L12 as the boundary. The third light-emitting element 20*c* is disposed in a position closer to the wiring region 14 provided in the region not including the point p1*a* with the imaginary line L12 as the boundary than the wiring region 14 provided in the region not including the point p2*a* with the imaginary line L11 as the boundary.

The plurality of wiring regions 14 included in the first wiring region include two wiring regions 14 spaced apart from each other in a direction perpendicular to the emission end surface 21. The two wiring regions 14 are disposed side by side in the direction perpendicular to the emission end surface 21. At least a part of each of the two wiring regions 14 is provided in the region A1. In the illustrated light-emitting device 100, the wiring region 14*a*1 and the wiring region 14*b*1 correspond to the two wiring regions 14. Furthermore, the wiring region 14*c*1 and the wiring region 14*d*1 also correspond to the two wiring regions 14. For both of the two wiring regions 14 including the wiring region 14*a*1 and the wiring region 14*b*1, and the two wiring regions 14 including the wiring region 14*c*1 and the wiring region 14*d*1, each of the two wiring regions 14 is partially provided in the region A1.

The region A1 may be a region between the imaginary line L13 and the imaginary line L14, and between an imaginary line L3 and an imaginary line L4 (see FIG. 5). The imaginary line L3 is parallel to the emission end surface 21*a* through one point p5 of two points at which an imaginary line L10 perpendicular to the emission end surface 21*a* through the inside of the outer edge of the first light-emitting element 20*a* intersects the outer edge of the first light-emitting element 20*a* in the top view. The imaginary line L4 is parallel to the emission end surface 21*a* through the other point p6 of the two points. The description of the first wiring region described above also applies to this case.

The first wiring region is electrically connected to the wiring region 54 of the photodetector 50. Each of wiring regions 54*a*, 54*b*, 54*c*, and 54*d* illustrated in FIG. 3 is the wiring region 54 electrically connected to the first wiring region. The one or the plurality of wiring regions 54 electrically connected to the first wiring region are collectively referred to as a second wiring region below. It can be said that the photodetector 50 includes the second wiring region including the plurality of wiring regions 54 spaced apart from each other.

The plurality of wiring regions 54 included in the second wiring region include the wiring region 54 provided between the imaginary line L11 and the imaginary line L13, and the wiring region 54 provided between the imaginary line L12 and the imaginary line L14.

The wiring region 54 provided between the imaginary line L11 and the imaginary line L13 can be provided between the imaginary line L21 and the imaginary line L13. Furthermore, this wiring region 54 can be provided between the imaginary line L41 and the imaginary line L13. Furthermore, the imaginary line L13 passes through the wiring region 14 electrically connected to this wiring region 54. This wiring region 14 extends further than this wiring region 54 in the first direction 1D.

The wiring region 54 provided between the imaginary line L12 and the imaginary line L14 can be provided between the imaginary line L32 and the imaginary line L14. Furthermore, this wiring region 54 can be provided between the imaginary line L42 and the imaginary line L14. Furthermore, the imaginary line L14 passes through the wiring region 14 electrically connected to this wiring region 54. This wiring region 14 extends further than this wiring region 54 in the first direction 1D.

Of the plurality of wiring regions 14 provided on the upper surface of the base member 11, the one or the plurality of wiring regions 14 electrically connected to the light-emitting element 20 are collectively referred to as a third wiring region. It can be said that the third wiring region including the plurality of wiring regions 14 spaced apart from each other is provided in the light-emitting device 100.

A distance from the third wiring region to the photodetector 50 is greater than a distance from the first wiring region to the photodetector 50. In the top view, the third wiring region is provided in a region not including the photodetector 50 with the imaginary line L3 parallel to the emission end surface 21 through the emission end surface 21, as a boundary, and the third wiring region is not provided in a region including the photodetector 50 with the imaginary line L3 parallel to the emission end surface 21 through the emission end surface 21, as a boundary.

The wiring region 14 included in the first wiring region and the wiring region 14 included in the third wiring region are disposed side by side in the second direction 2D. A length of the first wiring region in the second direction is less than a length of the third wiring region in the second direction. Of the two wiring regions 14 disposed side by side, a length, in the first direction, of the wiring region 14 included in the first wiring region is equal to or less than a length, in the first direction, of the wiring region 14 included in the third wiring region.

In the light-emitting device 100, the protective element 60A is disposed in the third wiring region. The protective element 60A is provided to protect the light-emitting element 20. The protective element 60A that protects the first light-emitting element 20a is disposed across the two wiring regions 14 electrically connected to the first light-emitting element 20a. The protective element 60A that protects the second light-emitting element 20b is disposed across the two wiring regions 14 electrically connected to the second light-emitting element 20b. The protective element 60A that protects the third light-emitting element 20c is disposed across the two wiring regions 14 electrically connected to the third light-emitting element 20c.

The length, in the second direction, of the wiring region 14 included in the first wiring region is less than the length, in the second direction, of the wiring region 14 included in the third wiring region. The length, in the second direction, of the wiring region 14 included in the first wiring region is less than that of the wiring region 14 in the third wiring region in which the component such as the protective element 60A is disposed, and thus a reduction in size of the light-emitting device 100 can be achieved.

Of the plurality of wiring regions 14 provided on the upper surface of the base member 11, the one or the plurality of wiring regions 14 electrically connected to the temperature measuring element 60B are collectively referred to as a fourth wiring region. It can be said that the fourth wiring region including the plurality of wiring regions 14 spaced apart from each other is provided in the light-emitting device 100.

A distance from the fourth wiring region to the photodetector 50 is greater than the distance from the first wiring region to the photodetector 50. In the top view, the fourth wiring region is provided in the region not including the photodetector 50 with the imaginary line L3 parallel to the emission end surface 21 through the emission end surface 21, as the boundary, and the fourth wiring region is not provided in the region including the photodetector 50 with the imaginary line L3 parallel to the emission end surface 21 through the emission end surface 21, as the boundary.

In the light-emitting device 100, the wiring line 71 electrically connects the light-emitting element 20 and the third wiring region. The wiring line 71 is bonded to the third wiring region. The wiring line 72 is bonded to the first wiring region and the second wiring region. One wiring line 72 is bonded to one of the plurality of wiring regions 14 included in the first wiring region and to one of the plurality of wiring regions 14 included in the second wiring region. The light-emitting device 100 includes the same number of the wiring lines 72 as the number of the wiring regions 14 included in the first wiring region. Note that the light-emitting device 100 can also include the number of the wiring lines 72 equal to or greater than the number of the wiring regions 14 included in the first wiring region.

In the light-emitting device 100, the wiring line 72a is bonded to one of the two wiring regions 14a1 and 14b1, and the wiring line 72b is bonded to the other of the two wiring regions 14a1 and 14b1. The wiring line 72a is bonded to the first wiring region in one region of regions divided into two with the imaginary line L3 as the boundary in the top view, and the wiring line 72b is bonded to the first wiring region in the other region of the regions divided into two. The wiring line 72a bonded to the wiring region 14a1 that is a wiring region closer to the photodetector 50 among the two wiring regions 14 is bonded to the wiring region 54a that is a wiring region farther from the first wiring region among the two wiring regions 54a and 54b.

In the light-emitting device 100, the wiring line 72c is bonded to one of the two wiring regions 14c1 and 14d1, and the wiring line 72d is bonded to the other of the two wiring regions 14c1 and 14d1. The wiring line 72c is bonded to the first wiring region in one region of the regions divided into two with the imaginary line L3 as the boundary in the top view, and the wiring line 72d is bonded to the first wiring region in the other region of the regions divided into two. The wiring line 72c bonded to the wiring region 14c1 that is a wiring region closer to the photodetector 50 among the two wiring regions 14 is bonded to the wiring region 54c that is a wiring region farther from the first wiring region among the two wiring regions 54c and 54d.

A distance, in the first direction 1D, between a position in which the wiring line 72a is bonded to the wiring region 54a and a position in which the wiring line 72b is bonded to the wiring region 54b is less than a distance, in the first direction 1D, between a position in which the wiring line 72*a* is bonded to the wiring region 14*a*1 and a position in which the wiring line 72*b* is bonded to the wiring region 14*b*1. In this way, electrical connection can be achieved in the small first wiring region, and a reduction in size of the light-emitting device 100 can be achieved.

In the light-emitting device 100, the optical member 40 is disposed above the photodetector 50. The optical member 40 is disposed on the upper surface of the photodetector 50. The optical member 40 is bonded to the photodetector 50. The optical member 40 is mounted such that the lower surface of the optical member 40 and the light receiving surface 52 of the photodetector 50 face each other.

The optical member 40 is disposed in a position where the imaginary line L11 and the imaginary line L12 pass through in the top view. The optical member 40 is disposed in a position where the imaginary line L21 and the imaginary line L22 pass through in the top view. The optical member 40 is disposed in a position where the imaginary line L31 and the imaginary line L32 path through in the top view. The optical member 40 is disposed in a position where the imaginary line L41 and the imaginary line L42 pass through in the top view. The optical member 40 is disposed between the two wiring regions 54 included in the second wiring region in the top view.

In the top view, any imaginary line being an imaginary line perpendicular to the emission end surface 21*a* through the optical member 40 does not pass through the wiring region 14 included in the first wiring region. The optical member 40 is disposed in such a manner, and thus the second wiring region can be set closer to the first wiring region, and a reduction in size of the light-emitting device 100 can be achieved.

The light emitted from each of the one or the plurality of light-emitting elements 20 is incident on the optical member 40. The light of the main portion of the light emitted from each of the one or the plurality of light-emitting elements 20 is incident on the optical member 40. The divergent light emitted from each of the one or the plurality of light-emitting elements 20 is incident on the optical member 40.

The optical member 40 reflects a part of the incident divergent light and transmits the remaining light. The incident light is divided into transmitted light and reflected light by the partial reflective surface 41 of the optical member 40. The transmitted light is emitted from the light extraction surface 10A, and the reflected light is applied to the light receiving surface 52 of the photodetector 50. Of the transmitted light and the reflected light divided by the optical member 40, the transmitted light can be used as the main light, and the reflected light can be used as the monitor light.

The light receiving surface 52 of the photodetector 50 receives at least a part of the light emitted from the emission end surface of the light-emitting element 20. Note that the photodetector 50 may receive a part of the light emitted from the light-emitting element 20 without passing through the optical member 40 instead of receiving the light optically controlled by the optical member 40.

The first light receiving region 53*a* of the photodetector 50 receives a part of light emitted from the first light-emitting element 20*a*. In the top view, the first light receiving region 53*a* is provided so as to be passed by the imaginary line L11 and the imaginary line L12. In the photodetector 50, only the first light receiving region 53*a* receives the light of the main portion emitted from the first light-emitting element 20*a*.

The second light receiving region 53*b* of the photodetector 50 receives a part of light emitted from the second light-emitting element 20*b*. In the top view, the second light receiving region 53*b* is provided so as to be passed by the imaginary line L21 and the imaginary line L22. In the photodetector 50, only the second light receiving region 53*b* receives the light of the main portion emitted from the second light-emitting element 20*b*.

The third light receiving region 53*c* of the photodetector 50 receives a part of light emitted from the third light-emitting element 20*c*. In the top view, the third light receiving region 53*c* is provided so as to be passed by the imaginary line L31 and the imaginary line L32. In the photodetector 50, only the third light receiving region 53*c* receives the light of the main portion emitted from the third light-emitting element 20*c*.

A length of the submount 30 in a direction parallel to the emission end surface 21*a* of the first light-emitting element 20*a* in the top view is less than the length of the photodetector 50. Furthermore, a length of the submount 30 in a direction perpendicular to the emission end surface 21*a* of the first light-emitting element 20*a* in the top view is greater than the length of the photodetector 50. By providing the photodetector 50 having such a shape, the light-emitting device 100 in small size can be achieved. Note that the direction parallel to the emission end surface 21*a* of the first light-emitting element 20*a* can be the same direction as the first direction 1D.

The light receiving surface 52 is provided in a position lower than an emission point of the light of the light-emitting element 20. With such an arrangement relationship, the light receiving region 53 can be provided directly below the partial reflective surface 41, and a size of the light-emitting device 100 in the second direction 2D can be suppressed.

In the top view, the length of the photodetector 50 in the first direction 1D is greater than the length of the submount 30 in the first direction 1D. In the top view, a difference between the length of the photodetector 50 in the first direction 1D and the length of the submount 30 in the first direction 1D is less than the length of the submount 30 in the first direction 1D. By satisfying such a relationship, an increase in a relative size ratio of the photodetector 50 with respect to the submount 30 can be suppressed, and a reduction in size of the light-emitting device 100 can be achieved.

In the top view, the one or the plurality of light receiving regions 53 are disposed inside a region sandwiched between two straight lines parallel to the second direction 2D through both ends of the submount 30 in the first direction 1D. Furthermore, in the top view, the one or the plurality of wiring regions 54 are disposed outside the region sandwiched between the two straight lines. By satisfying such a relationship, a size of the light-emitting device 100 in the first direction can be suppressed.

In the light-emitting device 100, the one or the plurality of light-emitting elements 20 are disposed in a closed space sealed inside the package 10. By bonding the substrate 15 and the cap 16 together in a predetermined atmosphere, a closed space hermetically sealed inside the package 10 is created. By hermetically sealing the space in which the light-emitting element 20 is disposed, a deterioration in quality due to dust gathering can be suppressed.

Second Embodiment

Figure 6:
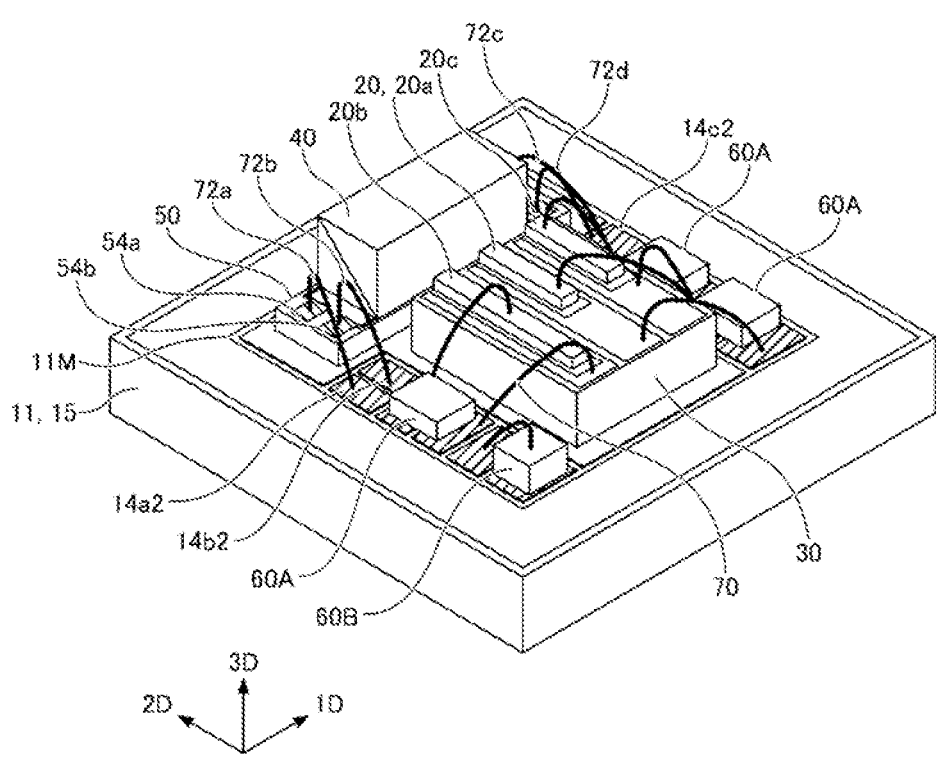
FIG. 6 is a perspective view of a light-emitting device according to a second embodiment excluding a cap of a package.
Figure 7:
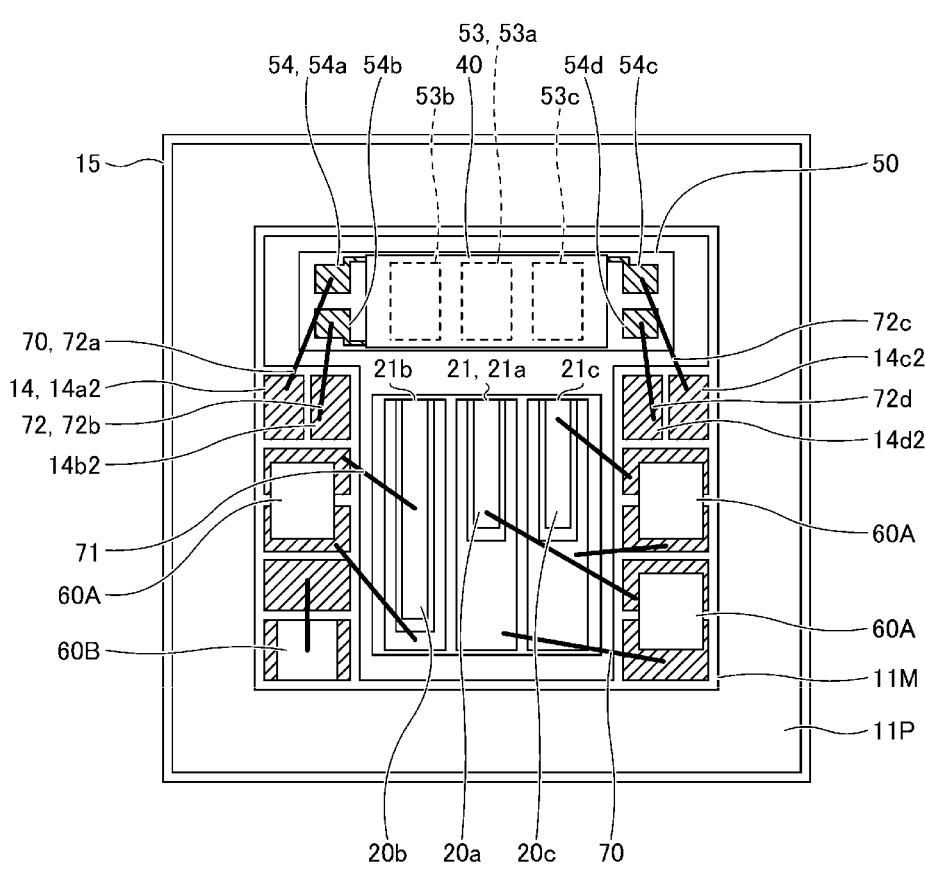
FIG. 7 is a top view of the light-emitting device according to the second embodiment excluding the cap of the package.
Figure 7:
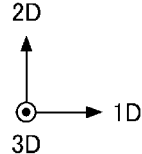
Figure 8:
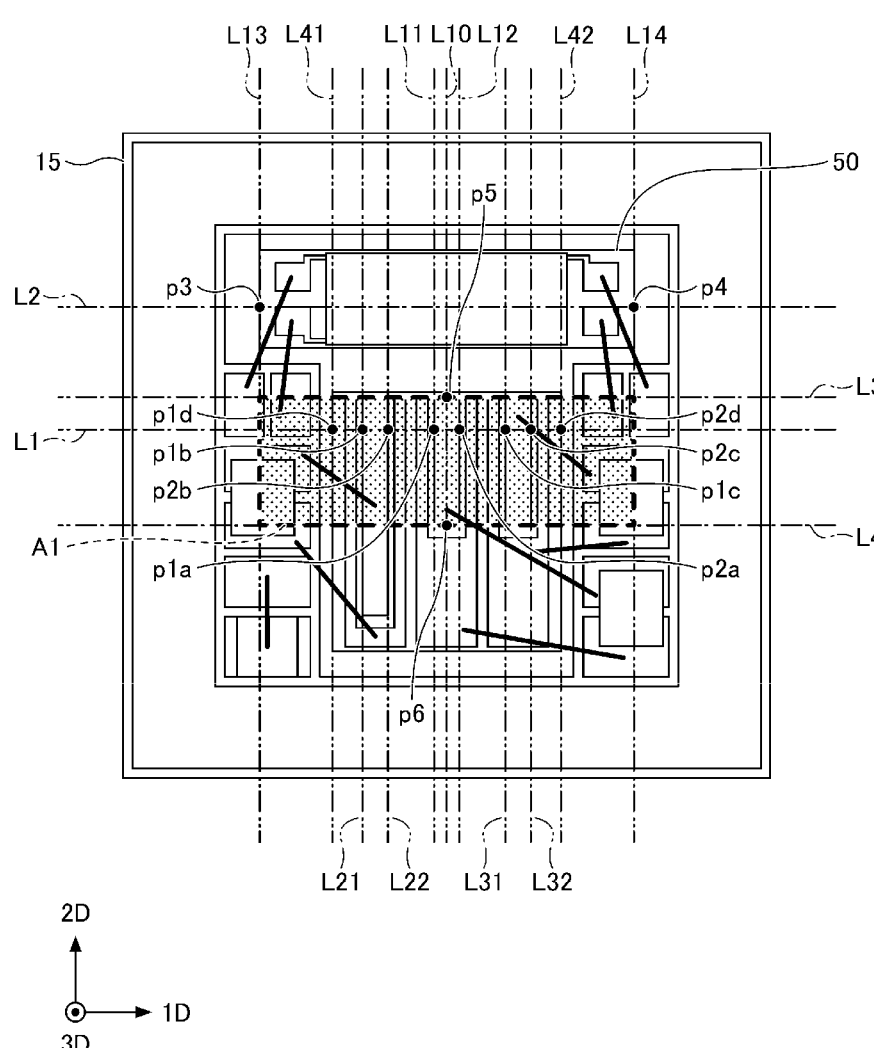
FIG. 8 is a diagram for a supplemental description of predetermined points, imaginary lines, regions, and the like in the light-emitting device according to the second embodiment.

A light-emitting device 200 according to a second embodiment will be described. FIG. 6 is a perspective view of the light-emitting device according to the second embodiment excluding a cap of a package. FIG. 7 is a top view of the light-emitting device according to the second embodiment excluding the cap of the package. FIG. 8 is a diagram for a supplemental description of predetermined points, imaginary lines, regions, and the like in the light-emitting device according to the second embodiment.

The light-emitting device 200 according to the second embodiment is the same as the light-emitting device 100 according to the first embodiment except that a first wiring region is provided differently. Thus, the description of the light-emitting device 200 other than the way of providing the first wiring region is as described in the first embodiment. Furthermore, in the description of the first embodiment, the description related to the first wiring region other than contents that are not consistent with FIGS. 7 and 8 also applies to the second embodiment. Wiring regions 14a2, 14b2, 14c2, and 14d2 illustrated in FIG. 7 are wiring regions 14 included in the first wiring region of the light-emitting device 200.

In the light-emitting device 200, the plurality of wiring regions 14 included in the first wiring region include two wiring regions 14 spaced apart from each other in a direction parallel to an emission end surface 21. The two wiring regions 14 are disposed side by side in the direction parallel to the emission end surface 21. At least a part of one wiring region 14 of the two wiring regions 14 is provided in a region A1. Furthermore, at least a part of the other wiring region 14 of the two wiring regions 14 is provided outside the region A1. In the illustrated light-emitting device 200, the wiring region 14a2 and the wiring region 14b2 correspond to the two wiring regions 14. Furthermore, the wiring region 14c2 and the wiring region 14d2 also correspond to the two wiring regions 14. For both of the two wiring regions 14 of the wiring region 14a2 and the wiring region 14b2, and the two wiring regions 14 of the wiring region 14c2 and the wiring region 14d2, all of one wiring region 14 of the two wiring regions 14 is provided between an imaginary line L13 and an imaginary line L14.

In the light-emitting device 200, a length, in a second direction, of the wiring region 14 included in the first wiring region is greater than a length, in the second direction, of the wiring region 14 included in a third wiring region. On the other hand, a length, in a first direction, of the wiring region 14 included in the first wiring region is less than a length, in the first direction, of the wiring region 14 included in the third wiring region. Even when the wiring region 14 included in the first wiring region and the wiring region 14 included in the third wiring region are disposed in such a manner, a reduction in size of the light-emitting device 200 can be achieved.

Although the embodiments according to the present invention have been described above, the light-emitting device according to the present invention is not strictly limited to the light-emitting devices of the embodiments. In other words, the present invention can be achieved without being limited to the external shape or structure of the light-emitting device disclosed by each of the embodiments. For example, a light-emitting device that does not include a protective element may be applicable. Furthermore, it can be applied without requiring all the components being sufficiently provided. For example, in a case in which some of the components of the light-emitting device disclosed by the embodiments are not stated in the scope of the claims, the degree of freedom in design by those skilled in the art such as substitutions, omissions, shape modifications, and material changes for those components is allowed, and then the invention stated in the scope of the claims being applied to those components is specified.

The light-emitting device according to each of the embodiments can be used for a head-mounted display, a projector, lighting, a display, and the like.

What is claimed is:

1. A light-emitting device comprising:
a base member having an upper surface and a first wiring region arranged on the upper surface;
a first light-emitting element disposed on the upper surface of the base member and having a first emission end surface configured to emit light;
a photodetector disposed on the upper surface of the base member and having a light receiving surface configured to receive at least a part of the light emitted from the first emission end surface, the photodetector having a second wiring region; and
one or a plurality of wiring lines, which includes a first wiring line that electrically connects between the first wiring region and the second wiring region, wherein
the photodetector is positioned so that an imaginary line perpendicular to the first emission end surface through a first point and an imaginary line perpendicular to the first emission end surface through a second point pass through the photodetector, the first point and the second point being two points at which an imaginary line parallel to the first emission end surface through an inside of an outer edge of the first light-emitting element intersects the outer edge of the first light-emitting element in a top view,
at least a part of the first wiring region is arranged in a first region between an imaginary line perpendicular to the first emission end surface through a third point and an imaginary line perpendicular to the first emission end surface through a fourth point, the third point and the fourth point being two points at which an imaginary line parallel to the first emission end surface through an inside of an outer edge of the photodetector intersects the outer edge of the photodetector in the top view,
the first region is a region between imaginary lines parallel to the first emission end surface respectively through two points at which an imaginary line perpendicular to the first emission end surface through the inside of the outer edge of the first light-emitting element intersects the outer edge of the first light-emitting element in the top view, and
the first wiring region to which the first wiring line is bonded is arranged in the first region.

2. The light-emitting device according to claim 1, wherein the first wiring region includes a plurality of first wiring regions spaced apart from each other, and at least a part of each of the plurality of first wiring regions is arranged in the first region.

3. The light-emitting device according to claim 2, wherein the plurality of first wiring regions include two wiring regions spaced apart from each other in a direction perpendicular to the first emission end surface.

4. The light-emitting device according to claim 3, wherein at least a part of each of the two wiring regions is arranged in a region not including the second point with the imaginary line perpendicular to the first emission end surface through the first point in the top view as a boundary.

5. The light-emitting device according to claim 4, wherein the plurality of first wiring regions includes two more wiring regions, and at least a part of each of the two more wiring regions is arranged in a region not including the first point with the imaginary line perpendicular to the first emission end surface through the second point in the top view as a boundary.

6. The light-emitting device according to claim 3, wherein the one or the plurality of wiring lines further include a second wiring line, wherein the first wiring line is bonded to one of the two wiring regions, and the second wiring line is bonded to the other of the two wiring regions, and the first wiring line is bonded to the first wiring region in one of two regions divided by an imaginary line parallel to the first emission end surface through the first emission end surface in the top view, and the second wiring line is bonded to the first wiring region in the other of the two regions.

7. The light-emitting device according to claim 6, wherein the base member further includes a third wiring region arranged on the upper surface, the one or the plurality of wiring lines further includes a third wiring line bonded to the third wiring region, the first wiring line and the second wiring line electrically connect the first wiring region and the second wiring region, the third wiring line electrically connects the first light-emitting element and the third wiring region, and a distance from the third wiring region to the photodetector is greater than a distance from the first wiring region to the photodetector.

8. The light-emitting device according to claim 2, further comprising a second light-emitting element disposed on the upper surface of the base member and comprising an second emission end surface configured to emit light, wherein the photodetector includes a first light receiving region configured to receive a part of the light emitted from the first emission end surface and a second light receiving region configured to receive a part of the light emitted from the second emission end surface, the first light receiving region is arranged at a position where the imaginary line perpendicular to the first emission end surface in the top view through the first point and the imaginary line perpendicular to the first emission end surface through the second point in the top view pass through the first light receiving region, the second light receiving region is arranged at a position where imaginary lines perpendicular to the second emission end surface of the second light-emitting element respectively through two points, at which an imaginary line parallel to the second emission end surface of the second light-emitting element through an inside of an outer edge of the second light-emitting element intersects the outer edge of the second light-emitting element in the top view, pass through the second light receiving region, the second wiring region includes a plurality of second wiring regions spaced apart from each other, the plurality of first wiring regions include
 a wiring region arranged in a region including the second point, and
 a wiring region arranged in a region not including the second point with the imaginary line perpendicular to the first emission end surface through the first point in the top view as a boundary, and the plurality of second wiring regions include
 a wiring region arranged between the imaginary line perpendicular to the first emission end surface through the first point in the top view and an imaginary line perpendicular to the first emission end surface through the third point in the top view, and
 a wiring region arranged between the imaginary line perpendicular to the first emission end surface through the second point in the top view and the imaginary line perpendicular to the first emission end surface through the fourth point in the top view.

9. The light-emitting device according to claim 8, further comprising
 a submount disposed on the base member and where the first light-emitting element and the second light-emitting element are disposed, wherein
 in a direction parallel to the first emission end surface of the first light-emitting element in the top view, a length of the submount is less than a length of the photodetector, and
 in a direction perpendicular to the first emission end surface of the first light-emitting element in the top view, a length of the submount is greater than a length of the photodetector.

10. The light-emitting device according to claim 1, wherein
 the first wiring region includes a plurality of first wiring regions spaced apart from each other,
 the plurality of first wiring regions include two wiring regions spaced apart from each other in a direction parallel to the first emission end surface, and
 at least a part of one of the two wiring regions is arranged in the first region.

11. The light-emitting device according to claim 10, wherein
 at least a part of the other of the two wiring regions is arranged outside the first region.

12. The light-emitting device according to claim 1, wherein
 the photodetector is arranged at a predetermined distance in a direction perpendicular to the first emission end surface of the first light-emitting element, and positioned to receive a main portion of light emitted from the first light-emitting element.

* * * * *